United States Patent [19]
Yamazaki

[11] Patent Number: 6,107,654
[45] Date of Patent: Aug. 22, 2000

[54] SEMICONDUCTOR DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 09/248,348

[22] Filed: Feb. 8, 1999

[30] Foreign Application Priority Data

Feb. 9, 1998 [JP] Japan .................................. 10-044657

[51] Int. Cl.[7] .............................................. H01L 31/0328
[52] U.S. Cl. .......................................................... 257/194
[58] Field of Search ............................................. 257/194

[56] References Cited

U.S. PATENT DOCUMENTS

| 4,549,336 | 10/1985 | Sheppard . | |
|---|---|---|---|
| 4,710,788 | 12/1987 | Dambkes et al. | 357/22 |
| 5,210,437 | 5/1993 | Sawada et al. . | |
| 5,272,365 | 12/1993 | Nakagawa | 257/194 |
| 5,324,960 | 6/1994 | Pfiester et al. . | |
| 5,461,250 | 10/1995 | Burghartz et al. | 257/347 |
| 5,786,618 | 7/1998 | Wen . | |
| 5,859,443 | 1/1999 | Yamazaki et al. | 257/65 |
| 5,905,291 | 5/1999 | Utsunomiya et al. . | |
| 5,952,699 | 9/1999 | Yamazaki et al. . | |

FOREIGN PATENT DOCUMENTS

WO 88/03328  5/1988  WIPO .

Primary Examiner—Olik Chaudhuri
Assistant Examiner—Douglas A. Wille
Attorney, Agent, or Firm—Fish & Richardson P.C.

[57] ABSTRACT

There is provided a semiconductor device having a novel structure in which high operating performance and high reliability can be achieved at the same time.

In an active region 102 sandwiched by a source region 101 and a drain region 103 constituted by a crystalline semiconductor, a $Si_xGe_{1-x}$ (0<X<1) region 105 is formed by doping the same with germanium locally. The expansion of a depletion layer from the drain toward the source is effectively suppressed utilizing the difference in the band structures of the $Si_xGe_{1-x}$ region 105 and a Si region 106 doped with no germanium.

32 Claims, 10 Drawing Sheets

SEMICONDUCTOR DEVICE

BACKGROUND OF THE INVENTION

1. Field of the Invention

The present invention relates to semiconductor devices utilizing a crystalline semiconductor and, more particularly, to a configuration of an insulated gate type transistor. The present invention also relates to configurations of semiconductor circuits, electro-optical devices and electronic devices which are combinations of the same formed by such transistors and the like.

In the context of the present specification, such semiconductor circuits, electro-optical devices and electronic devices are all categorized as "semiconductor devices". That is, all devices which can function utilizing the characteristics of a semiconductor are referred to as "semiconductor devices". Therefore, the semiconductor devices claimed in the present application include not only individual elements such as transistors but also integrated circuits, electro-optical devices and electronic devices which are formed by integrating the same.

2. Description of the Related Art

There is an increasing trend toward finer device sizes in an attempt to improve the level of integration of VLSIs and ULSIs. The same trend similarly exists in the fields MOS-FETs utilizing bulk single crystals and TFTs utilizing thin films. There is needs for devices having a channel length of 1 $\mu$m or less and even devices of 0.2 $\mu$m or less.

A phenomenon referred to as "short channel effect" is known as a factor that hinders the efforts toward increased fineness. The short channel effect refers to various problems including a reduction in a source-drain withstand voltage and a reduction in a threshold voltage which occur as a result of a decrease in a channel length (see Mitsumasa Koyanagi et al. "Submicron Device I", pp. 88–138, Maruzen K.K., 1987).

According to the same article, one of the most commonly known causes of a reduction in a withstand voltage is a punch-through phenomenon. This phenomenon is a reduction in a diffusion potential at a source caused by the effect of the potential of a depletion layer closer to the drain as a result of a reduction in the channel length (a barrier lowering phenomenon induced by the drain), which makes it difficult to control majority carriers using the gate voltage.

Such short channel effects have become a problem which must be overcome in order to achieve higher fineness. A typical example of the short channel effects is a reduction in a threshold voltage, which is also considered as being caused by an expansion of a depletion layer.

Various countermeasures are taken against short channel effects as described above, and the most commonly employed countermeasure is channel doping. The channel doping is a technique to suppress the short channel effects by doping with a very small amount of impurity element such as P (phosphorus) or B (boron) throughout a channel formation region to a small depth (see Japanese unexamined patent publication No. H4-206971, No. H4-286339, etc.).

The channel doping is carried out in an attempt to control a threshold voltage and to suppress punch-through. However, the channel doping technique has a problem in that it places a significant limitation on the electric field effect mobility (hereinafter referred to as "mobility") of a TFT. Specifically, the movement of carriers is hindered by an impurity element which is intentionally added to reduce the mobility of the carries significantly.

The present invention has been conceived taking the above-described problems into consideration, and it is an object of the present invention to provide a semiconductor device having a completely novel structure with which high operational performance (high mobility) and high reliability (high withstand voltage characteristics) can be achieved simultaneously and a method for manufacturing the same.

SUMMARY OF THE INVENTION

According to an aspect of the present invention, there is provided a semiconductor device comprising a circuit formed by a transistor having a configuration including a source region, a drain region and an active region formed using a crystalline semiconductor, characterized in that:

the active region comprises a $Si_XGe_{1-X}$ (0<X<1) region formed by adding germanium locally thereto and a Si region added with no germanium; and the Si region suppresses the expansion of a depletion layer from the drain region toward the source region.

According to another aspect of the present invention, there is provided a semiconductor device comprising a transistor having a configuration including a source region, a drain region and an active region formed using a crystalline semiconductor, characterized in that:

the active region comprises a $Si_XGe_{1-X}$ (0<X<1) region formed by adding germanium locally thereto and a Si region added with an element selected from the 13 and 15 groups; and the Si region suppresses the expansion of a depletion layer from the drain region toward the source region and controls a threshold voltage.

In the above-described configuration, a structure is preferably employed in which the active region is formed by the $Si_XGe_{1-X}$ (0<X<1) region and Si region which are arranged substantially in parallel and alternately and in which the $Si_XGe_{1-X}$ (0<X<1) region is formed between the source region and drain region.

According to still another aspect of the present invention, there is provided a semiconductor device comprising a circuit formed by a transistor having a configuration including a source region, a drain region and an active region formed using a crystalline semiconductor, characterized in that a $Si_XGe_{1-X}$ (0<X<1) region formed by adding germanium thereto and a Si region added with no germanium are arranged in the active region substantially in parallel and alternately with each other and that the $Si_XGe_{1-X}$ (0<X<1) region is formed between the source region and drain region.

According to still another aspect of the invention, there is provided a semiconductor device comprising a circuit formed by a transistor having a configuration including a source region, a drain region and an active region formed using a crystalline semiconductor, characterized in that $Si_XGe_{1-X}$ (0<X<1) regions formed by adding germanium thereto are locally provided at intervals from each other at the junction between the active region and source region.

According to still another aspect of the present invention, there is provided a semiconductor device comprising a circuit formed by a transistor having a configuration including a source region, a drain region and an active region formed using a crystalline semiconductor, characterized in that $Si_XGe_{1-X}$ (0<X<1) regions formed by adding germanium thereto are locally provided at intervals from each other at the junction between the active region and drain region.

The principle behind the present invention is to form two types of regions having different band structures intentionally by adding germanium to an active region locally, thereby suppressing the expansion of depletion layer from the drain toward the source utilizing the difference between the band structures. An active region is a region which is sandwiched between a source region and a drain region (or between "LDD regions").

The inventors define that a term "pinning" means "suppressing" because the effect of suppressing a depletion layer seems like stopping the depletion layer with a pin. A semiconductor device according to the present invention is referred to as "pinning FET" (or "pinning TFT") to clearly distinguish it from semiconductor devices according to the prior art.

Semiconductor devices according to the present invention having configurations as described above exhibit high operational performance and high reliability at the same time. Semiconductor devices according to the present invention will be described below in detail with reference to embodiments of the present invention.

DETAILED DESCRIPTION OF PREFERRED EMBODIMENTS

A first embodiment of the present invention will now be described.

Figure 1A:
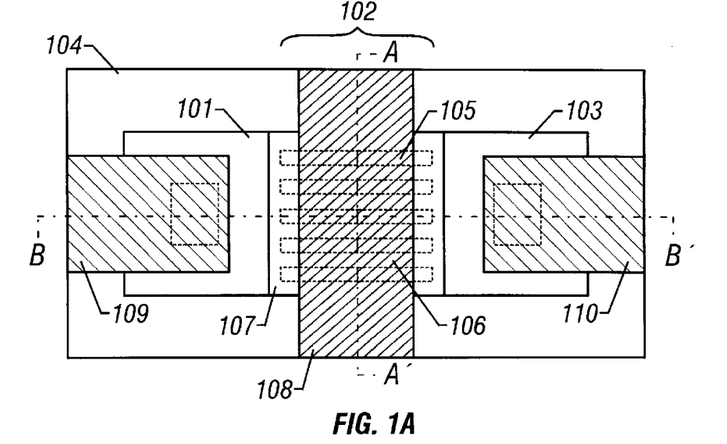
FIGS. 1A through 1C illustrate a configuration of a semiconductor device (FET) according to the present invention.
Figure 1B:
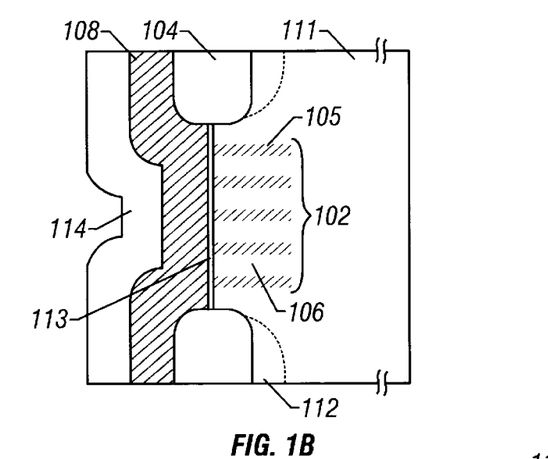
Figure 1C:
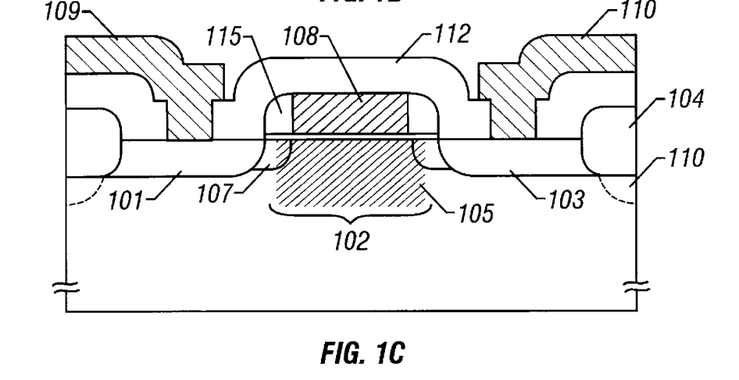

A description will now be made with reference to FIGS. 1A, 1B and 1C on a structure of a pinning FET according to the present invention. FIG. 1A is a plan view. FIG. 1B is a sectional view taken along the line A–A' in the plan view. FIG. 1C is a sectional view taken along the line B–B' in the plan view.

Referring to FIG. 1A, 101 designates a source region; 102 designates an active region; 103 designates a drain region; and 104 designates a field oxide film. A plurality of regions 105 provided across the active region 102 are regions formed by doping with germanium (Ge) locally (hereinafter simply referred to as "$Si_XGe_{1-X}$ (0<X<1) regions).

A composition expressed by $Si_XGe_{1-X}$ satisfies a relationship "0<X<1". That is, a $Si_XGe_{1-X}$ region does not have a composition comprising only Si or Ge. Specifically, germanium is added at a concentration such that x is within the range from 0.05 to 0.95.

Regions 106 within the active region 102 doped with no germanium are regions formed by silicon which is intrinsic or substantially intrinsic (hereinafter simply referred to as "Si regions").

Further, LDD regions 107 are provided on both sides of the active region 102, and a gate electrode 108 is provided above the active region 102 with a gate insulation film interposed therebetween. Conductive silicon is used as this gate electrode 108. Alternatively, it is possible to use materials mainly composed of aluminum or tantalum, tungsten, molybdenum or the like. A source electrode 109 and a drain electrode 110 are provided in contact with the source region 101 and drain region 103 with layer insulation films interposed.

A description will now be made on the $Si_XGe_{1-X}$ regions and Si regions which are characteristic of the present invention. According to the present invention, the active region 102 is formed by the $Si_XGe_{1-X}$ regions 105 and Si regions 106 as described above. The most typical configuration is a configuration as shown in FIG. 1A in which the $Si_XGe_{1-X}$ regions 105 and Si regions 106 are alternately arranged substantially in parallel with each other. In such a configuration, the active region 102 can be regarded as being separated into a plurality of Si regions 106 by $Si_XGe_{1-X}$ regions 105.

The $Si_XGe_{1-X}$ regions 105 may be formed by adding germanium using an ion implantation process on a mass separated basis. A description will now be made on changes in a bandgap as a result of the addition of germanium.

Figure 2:
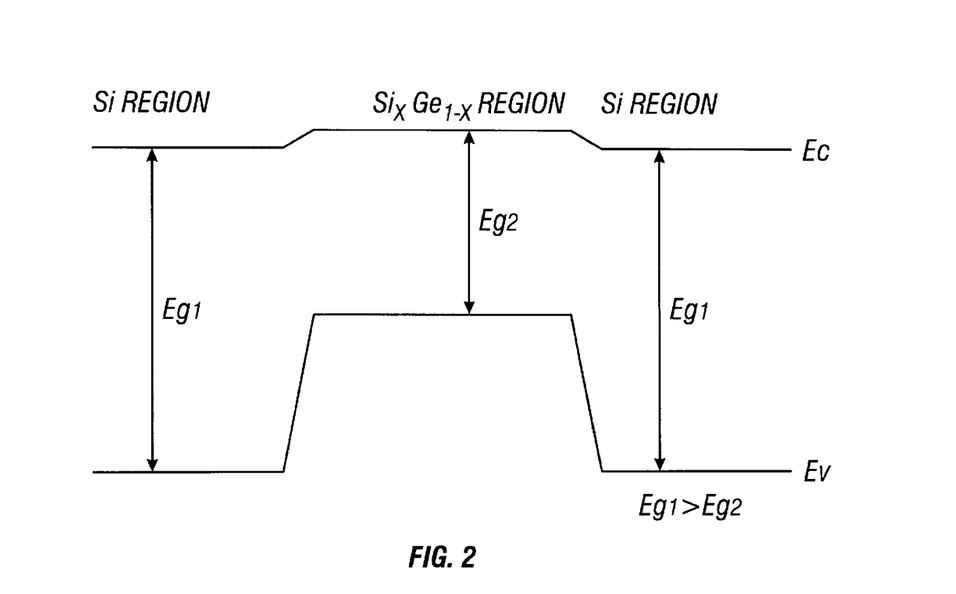
FIG. 2 illustrates a band structure of an active region.

The energy band diagram shown in FIG. 2 schematically illustrates changes in a band structure between the adjacent $Si_XGe_{1-X}$ regions and Si regions. Although a band structure at an interface between Si and $Si_XGe_{1-X}$ is still under studies, it has been reported that a band structure as shown in FIG. 2 is formed in the vicinity of an interface between a $Si_XGe_{1-X}$ layer and a Si layer.

Specifically, an extremely narrow gap is formed in a $Si_XGe_{1-X}$ region where the valence band (Ev) is raised significantly higher than the conduction band (Ec). Therefore, a bandgap ($Eg_2$) at a $Si_XGe_{1-X}$ region is smaller than a bandgap ($Eg_1$) at a Si region as in the schematic view shown in FIG. 2.

A bandgap at a $Si_XGe_{1-X}$ region varies depending on the amount of germanium included in the composition thereof. According to the present invention, X is varied such that 0<X<1, preferably 0.05<X<0.95 (typically 0.5<X<0.95), is satisfied in a composition represented by $Si_XGe_{1-X}$. Under such control, a bandgap ($Eg_2$) at a $Si_XGe_{1-X}$ region varies within a range represented by 0.66<$Eg_2$<1.6 (typically 0.66<$Eg_2$<1.1).

In such a band structure, carriers (electrons or holes) tend to move through $Si_XGe_{1-X}$ regions having narrower energy gaps during the operation of an FET in preference. Therefore, the $Si_XGe_{1-X}$ regions function as paths for carrier movement. Such a tendency similarly exists in both of n-channel type and p-channel type devices.

Figure 3:
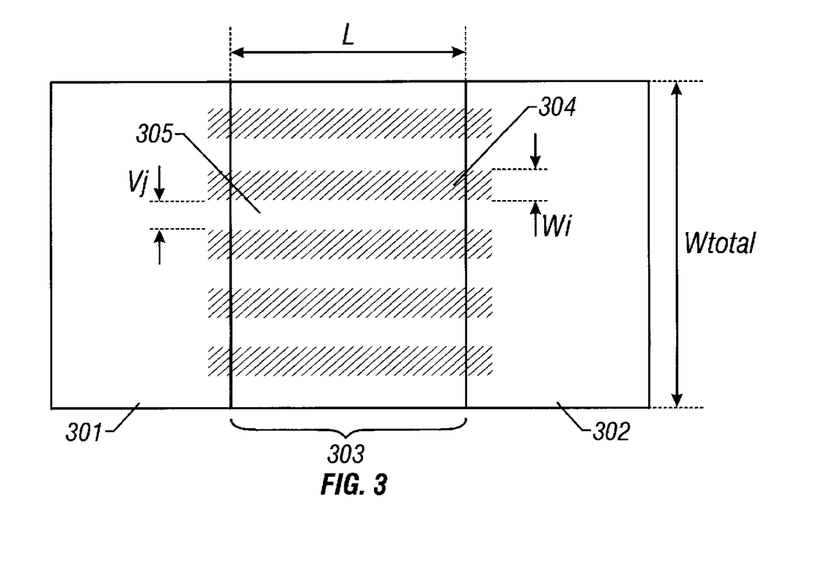
FIG. 3 illustrates definitions for a channel length and a channel width.

A channel length and a channel width will now be defined with reference to FIG. 3. Referring to FIG. 3, the distance between a source region 301 and a drain region 302 (which corresponds to the length of an active region 303) is defined as a channel length (L). The present invention is advantageous especially when this length is equal to or less than 2 μm, typically within the range from 30 to 500 nm (more preferably within the range from 50 to 200 nm). The direction of such a channel length is hereinafter referred to as "channel length direction".

The length of the active region 303 in a direction perpendicular to the channel length direction is referred to as "total channel width (W)". The direction of such a total channel width is hereinafter referred to as "channel width direction".

Next, the width of an arbitrary $Si_XGe_{1-X}$ region 304 (referred to as "channel width") is hereinafter represented by $w_i$. Preferably, the width $w_i$ is set at a minimum value such that no quantum effect occurs (approximately 3 nm) and at a maximum value which is similar to a maximum depletion layer width of a depletion layer near the drain.

The maximum depletion layer width is naturally determined by the concentration of the substrate (or well density) and the concentration of the impurity in the drain region. For example, it is approximately 300 nm when the concentration of the substrate or well is $1\times10^{16}$ atoms/cm$^3$.

For the above-mentioned reasons, the width ($w_i$) of the $Si_XGe_{1-X}$ region 304 may be less than 2 μm, preferably within the range from 50 to 300 nm (more preferably within the range from 1 to 50 nm). The sum W of the widths of all $Si_XGe_{1-X}$ regions present in the active region 303 is defined as shown below.

$$W = \sum_{i=1}^{m} V_i \qquad \text{(Equation 1)}$$

The $Si_XGe_{1-X}$ regions 304 act as regions through which carriers move (hereinafter referred to as "channel formation regions"). It is therefore necessary to provide at least one $Si_XGe_{1-X}$ region in the active region 303. This means that i=1 to m, i.e., the $Si_XGe_{1-X}$ region is formed in a quantity in the range from 1 to m. The above-described sum (W) of the channel widths ($w_i$) is referred to as "effective channel width".

Further, the $Si_XGe_{1-X}$ regions 304 can be formed by doping with germanium in the range from $1\times10^{17}$ atoms/cm$^3$ to $5\times10^{19}$ atoms/cm$^3$ (preferably from $1\times10^{18}$ atoms/cm$^3$ to $1\times10^{19}$ atoms/cm$^3$). The bandgap at the region 304 varies depending on this doping concentration. However, it is preferable to set a limit on the order of $1\times10^{19}$ atoms/cm$^3$ because excessive doping with germanium can hinder the movement of carriers.

The width of the Si region 305 (referred to as "pinning width") is represented by $v_j$. To achieve the pinning effect, the pinning width $v_j$ is set at 1 μm or less, preferably within the range from 50 to 300 nm (more preferably in the range from 1 to 50 nm) similarly to the $Si_XGe_{1-X}$ regions 304. The sum V of the widths $v_j$ of the Si regions 305 is defined as follows.

$$V = \sum_{j=1}^{n} V_j \qquad \text{(Equation 2)}$$

Since the Si regions 305 serve as regions to suppress the expansion of a depletion layer, at least one Si regions must be provided for the active region 303. This means that j=1 to n, i.e., the Si region is provided in a quantity within the range from 1 to n. The sum (V) of the above-described pinning widths $v_j$ is referred to as "effective pinning width".

The sum of the above-described effective channel width (W) and effective pinning width (V) is referred to as "total channel width ($W_{total}$) which is defined by the following equation.

$$W_{total} = W + V \qquad \text{(Equation 3)}$$

A semiconductor device according to the present invention defined as described above is based on an assumption that it is a semiconductor device having an extremely small channel length and, therefore, the $Si_XGe_{1-X}$ regions must be formed in extremely fine dimensions.

For this reason, the formation of the $Si_XGe_{1-X}$ regions 105 in FIG. 1A requires extremely fine lithography and ion implantation techniques. Specifically, it is preferable to use a combination of a lithographic technique utilizing an excimer laser, electron beams, X-rays or the like and an ion implantation technique based on ion implantation, plasma doping, laser doping or the like. It is also possible to perform impurity doping without a mask using focused ion beams (FIB) or the like.

It is preferable to employ an ion implantation technique that allows accurate control of density also in view of accurate control over the amount of germanium introduced, A description will now be made on FIG. 1B. The parts identical between FIGS. 1A and 1B are described using like reference numbers.

Referring to FIG. 1B, 111 designates a single crystal silicon substrate which is an n-type or p-type silicon substrate. As the silicon substrate 111, any silicon substrate formed using a normal CZ or FZ process or other methods may be used. However, it is preferable to use a high resistance silicon substrate with a small amount of dopant (a low concentration of impurities) to achieve high carrier mobility.

While the present embodiment refers to an example wherein a silicon substrate is directly used to form a pinning FET, a configuration may alternatively employed in which an n-type or p-type impurity well is formed and a pinning FET is formed therein.

112 designates a channel stopper formed under the field oxide film 104, 113 designates a gate insulation film, and 114 designates a layer insulation film. Regions in the active region 102 other than the $Si_XGe_{1-X}$ regions 105 are Si regions 106.

The $Si_XGe_{1-X}$ regions 105 are formed in the active region 102 in the form of stripes, which consequently forms the Si regions 106 also in the form of stripes. The Si regions 106 are formed deeply in order to pin a depletion layer which tends to spread from the drain toward the source effectively. Basically, the depth is preferably greater than the depth of the source-drain junction.

A description will now be made on FIG. 1C. Referring to FIG. 1C, regions 107 provided inside the source region 101 and drain region 103 are LDD regions. The LDD regions 107 are formed using side walls 115.

As shown in FIG. 1C, the $Si_XGe_{1-X}$ regions 105 are advantageously formed such that they extend into the LDD regions 107 to allow carriers to move smoothly until they reach the LDD regions. Obviously, they may be formed to extend into the drain region 103 or may be formed such that they will not extend into the LDD regions.

A pinning FET according to the present invention has a basic configuration as described above. What is most important here is the configuration of the active region, and the present invention is not limited to the structures shown in FIGS. 1A through 1C with respect to device structures which are not in a direct relationship with the active region.

The functions of the $Si_XGe_{1-X}$ regions 105 and Si regions 106 and effects achieved thereby will now be described with reference to an N-channel type FET as an example.

A first effect will be described. The most important purpose of the present invention is to suppress (pin) the expansion of a depletion layer from a drain toward a source, thereby preventing the lowering of a potential barrier at the source caused by a drain voltage. The suppression of the expansion of a depletion layer makes it possible to prevent a decrease in a withstand voltage attributable to a decrease in a threshold voltage or punch-through.

Referring to FIGS. 1A through 1C, the Si regions 106 locally left in the active region 102 act as a potential stopper (barrier) against a depletion layer which tends to spread from the drain to suppress the expansion of the depletion layer effectively. This prevents a diffusion potential at the source from being decreased by the expansion of the depletion layer, thereby preventing the punch-through phenomenon. Further, since this suppresses any increase in charge at the depletion layer attributable to the expansion of the depletion layer, any reduction in the threshold voltage can be avoided.

As described above, the formation of the $Si_XGe_{1-X}$ regions 105 in the active region separates the region into channel formation regions and pinning regions in the form of stripes. This makes it possible to suppress or prevent the short channel effect which has been a very serious problem to efforts toward higher fineness. This is the most important effect of a semiconductor device according to the present invention.

A second effect will now be described. In an n-channel type FET according to the present invention, since the $Si_XGe_{1-X}$ regions provided in the form of stripes function as channel formation regions, a path for carrier movement can be defined to prevent unwanted scattering of carriers.

Figure 4:
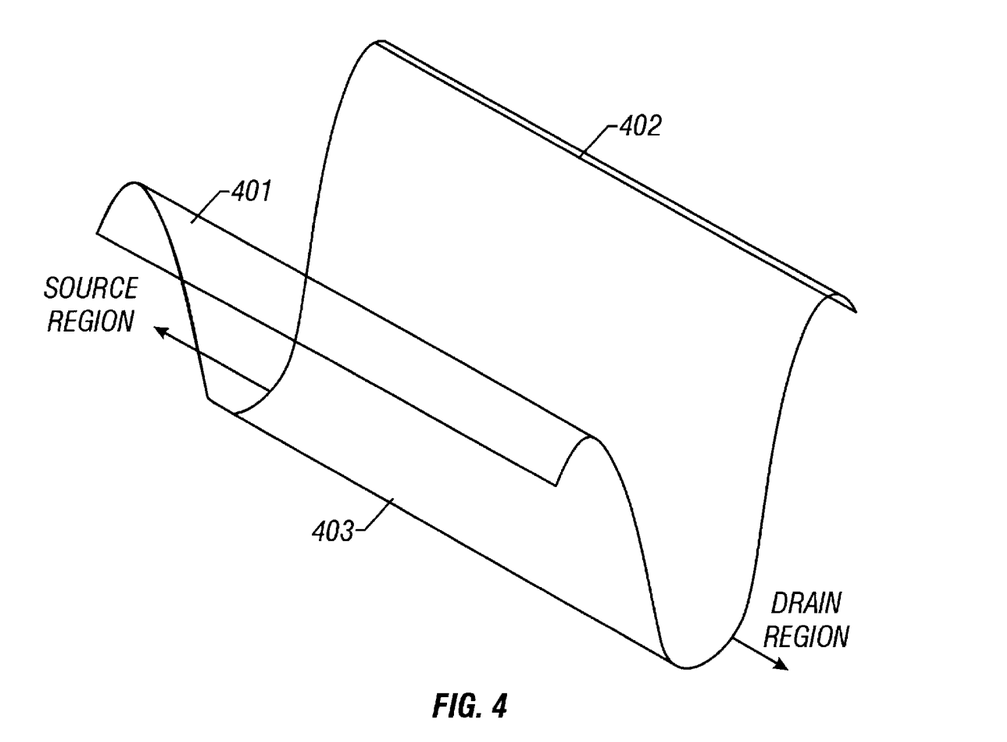
FIG. 4 illustrates a state of energy of an active region.

FIG. 4 shows the state of energy (state of potential) of the active region 102 during the operation of the pinning TFT of the present embodiment. In FIG. 4, the regions indicated by 401 and 402 correspond to the state of energy in the Si regions 106, and the region indicated by 403 corresponds to the state of energy in the $Si_XGe_{1-X}$ regions 105.

As apparent from FIG. 4, since the $Si_XGe_{1-X}$ regions 105 are sandwiched by the Si regions 106 having a bandgap larger than that of the $Si_XGe_{1-X}$ regions, electrons consequently move through the $Si_XGe_{1-X}$ regions 105 at a lower energy state in preference.

Both of the $Si_XGe_{1-X}$ regions and Si regions are intrinsic or substantially intrinsic regions. That is, an n-type pinning FET has a configuration in which the $Si_XGe_{1-X}$ regions 105 to serve as channel formation regions are constituted by intrinsic or substantially intrinsic regions and electrons move in such regions.

In this context, "an intrinsic region" is a region which is intentionally doped with neither impurity elements that provide n- or p-type properties nor impurity elements such as carbon, nitrogen, or oxygen. "A substantially intrinsic region" is a region which is doped with an impurity of the opposite conductivity type to cancel the conductivity intentionally or a region which exhibits one conductivity type within a range over which the threshold voltage can be controlled.

For example, a silicon substrate can be regarded intrinsic if it has a dopant concentration (concentration of phosphorus, arsenic, boron, indium, antimony or the like) of $1\times10^{18}$ atoms/cm$^3$ or less (preferably $1\times10^{17}$ atoms/cm$^3$) and includes carbon, nitrogen and oxygen at a concentration of $2\times10^{18}$ atoms/cm$^3$ or less.

In this sense, any single crystal silicon substrate commonly used for semiconductors may be regarded substantially intrinsic unless it is intentionally doped with an impurity element to provide one conductivity type when it is processes.

An n-type or p-type well formed at a concentration in the range from $1\times10^{17}$ atoms/cm$^3$ to $1\times10^{18}$ atoms/cm$^3$ as used in common VLSI processes may be regarded substantially intrinsic in a sense that it allows control over the threshold voltage.

When a region through which carriers move is intrinsic or substantially intrinsic, high mobility can be achieved because there is only an extremely small reduction in mobility attributable to the scattering of the impurity. This is a big difference between the present invention and the channel doping method.

Further, when linear $Si_XGe_{1-X}$ regions are provided between source and drain regions as shown in FIG. 1A, an advantage can be achieved in that paths for electron movement are defined by Si regions.

As described above, the state of energy of $Si_XGe_{1-X}$ regions sandwiched by Si regions is as shown in FIG. 4. The configuration shown in FIG. 1A can be regarded as an array of a plurality of slits in the state of energy as shown in FIG. 4.

Figure 5:
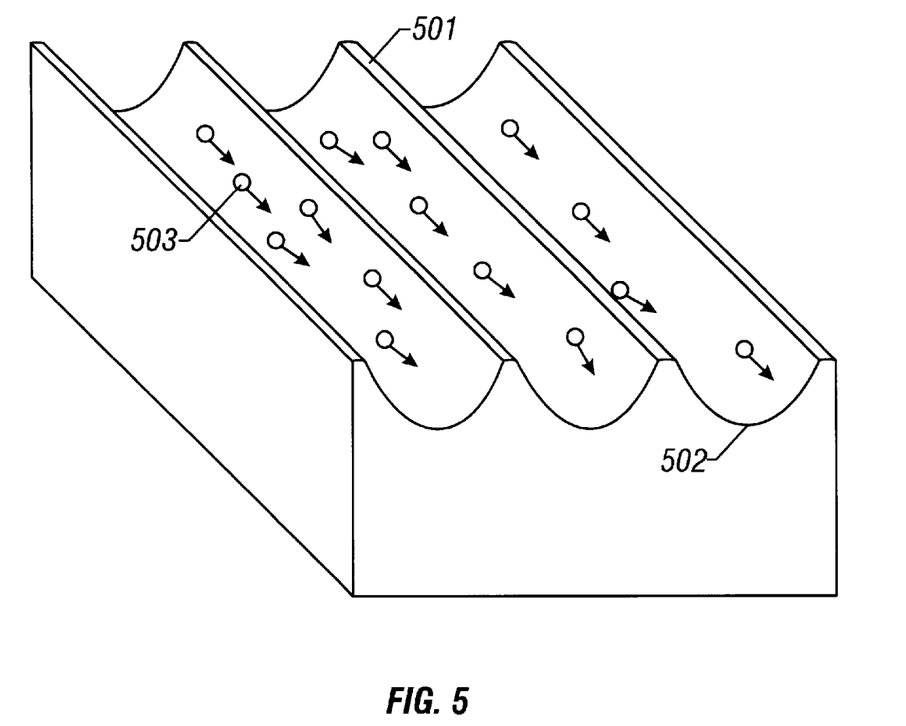
FIG. 5 schematically illustrates a state of energy of an active region.

FIG. 5 schematically illustrates such a state. In FIG. 5, 501 designates Si regions (pinning regions) and 502 designates $Si_XGe_{1-X}$ regions (channel formation regions). 503 designates majority carriers (electrons in this case). As shown in FIG. 5, the electrons 503 move through the $Si_XGe_{1-X}$ regions 502 which are lower in terms of energy in preference.

Scattering of carriers (carrier scattering) attributable to collision between carriers themselves is reduced by defining paths for the movement of the majority carriers in such a manner. This significantly contributes to the improvement of the mobility of an FET.

It is also known that a channel formation region formed by a $Si_XGe_{1-X}$ region has carrier mobility higher than that in a channel formation region formed by a Si layer. That is, the present invention is advantageous in that it makes it possible to achieve mobility higher than that achievable in conventional MOSFETs because $Si_XGe_{1-X}$ regions are used as paths for carrier movement.

A third effect will now be described. A pinning region according to the present invention plays a very important roll in preventing any reduction in a source-drain withstand voltage attributable to ionization by collision.

Minority carriers (holes in this case) generated by ionization by collision (impact ionization) can cause breakdown phenomena induced by carrier implantation by, for example, causing a parasitic bipolar transistor to conduct and accumulating in the vicinity of the source to reduce a diffusion potential at the source.

In the case of an n-channel type pinning FET having a structure as shown in FIGS. 1A through 1C, however, since the $Si_XGe_{1-X}$ regions 105 behave as trenches for holes in terms of potential (see FIG. 2), the holes generated by ionization by collision move to the $Si_XGe_{1-X}$ regions 105.

However, electrons are induced by the gate voltage to form a channel in an upper part of the $Si_XGe_{1-X}$ regions (especially in the vicinity of the interface between themselves and the gate insulation film). Since the holes generated as a result of impact ionization are moved by the gate voltage below the channel, they concentrate in a lower part of the $Si_XGe_{1-X}$ regions.

Then, the holes are pulled toward the source region because of the potential difference between the source and drain and flow in a lower part of the $Si_XGe_{1-X}$ regions to reach the source region 101. Since the holes pulled toward the source region in such a manner are extracted through an external terminal, it is possible to prevent the holes from flowing to or being accumulated at a substrate terminal.

Thus, pinning regions according to the present invention also serve as paths for causing minority carriers (holes in this case) generated as a result of ionization by collision to flow in a direction opposite to that of majority carriers (electrons in this case) and extracting them to the outside as they are.

Since it is possible to prevent breakdown phenomena as a result of ionization by collision induced by carrier injection, this third effect makes it possible to provide a reliable semiconductor device having a very high withstand voltage when combined with the first effect (the prevention of any reduction in the withstand voltage attributable to punch-through).

In a pinning TFT according to the present invention having the above-described effects, high reliability and high mobility can be achieved at the same time. While the above description has referred to an n-channel type FET as an example, the same effects can be basically achieved also in a p-channel type FET only except that holes and electrons are treated in a different manner.

A second embodiment of the present invention will now be described.

The first embodiment has referred to an example of the application of the present invention to a MOSFET utilizing a bulk single crystal. The present invention is not limited thereto and can be applied to thin film transistors (TFTs) utilizing crystalline semiconductor thin films.

Single crystal semiconductor thin films, polycrystalline semiconductor thin films and the like may be used as such crystalline semiconductor thin films. Single crystal semiconductor thin films can be provided using well-known techniques including processes utilizing oxygen ion implantation (SIMOX), processes utilizing lamination, ELTRAN processes and smart-cut processes.

Polycrystalline semiconductor thin films can be provided using processes of crystallizing amorphous semiconductor thin films using the techniques disclosed in Japanese unexamined patent publication No. H7-130652 and No. H9-312260 and techniques utilizing laser annealing or processes of forming such films directly using low pressure thermal CVD.

Especially, the use of the technique disclosed in Japanese unexamined patent publication No. H9-312260 makes it possible to provide silicon thin films having quite excellent crystallinity referred to as "continuous grain silicon (CGS) films". TFTs utilizing such silicon films can be used as devices to replace MOSFETs in LSI technology in the future because they have electrical characteristics better than those of conventional MOSFETs. Therefore, the present invention is quite advantageous when applied to TFTs utilizing such silicon films.

The present invention can be applied to other types of crystalline semiconductor thin films formed by any means. A description will now be made with reference to FIGS. 6A through 6C on a configuration of an application of the present invention to a TFT.

Referring to FIGS. 6A through 6C, 601 designates a source region; 602 designates a drain region; 603 designates an active region; 604 designates $Si_xGe_{1-x}$ regions; 605 designates Si regions; and 606 designates LDD regions. Those regions are formed using crystalline semiconductor thin films.

Figure 6A:
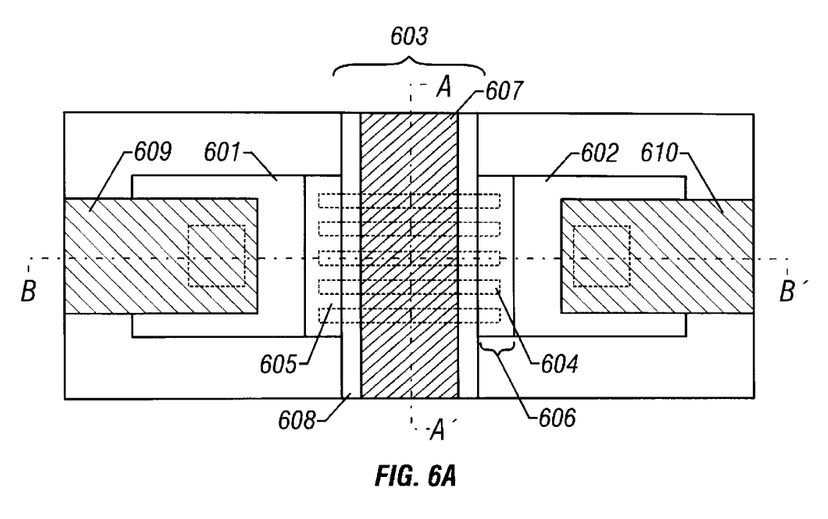
FIGS. 6A through 6C illustrate a configuration of a semiconductor device (TFT) according to the present invention.

Further, 607 designates a gate electrode whose main component is aluminum; 608 designates an anodic oxide film formed by anodizing the gate electrode; 609 designates a source electrode; and 610 designates a drain electrode. The gate electrode 607 may be formed from tantalum, tungsten, molybdenum or conductive silicon.

Figure 6B:
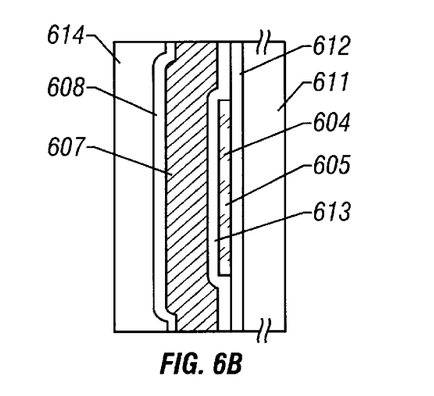

FIG. 6B shows a sectional view taken along the line A–A' in FIG. 6A. Referring to FIG. 6B, 611 designates a substrate having an insulated surface, and 612 designates an underlying film on which a crystalline semiconductor films are formed. A substrate resistant to the maximum process temperature is used as the substrate 611. 613 designates a gate insulation film on which the gate electrode 607 and anodic oxide film 608 are provided with a layer insulation film 614 thereon.

Figure 6C:
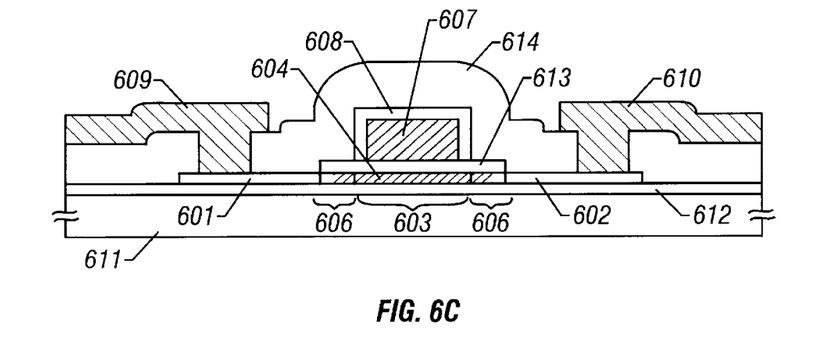

FIG. 6C shows a sectional view taken along the line B–B' in FIG. 6A. Although the TFT according to the present invention is similar to a TFT utilizing the technique disclosed in Japanese unexamined patent publication No. H7-135318 in its basic structure as shown in FIG. 6C, it is different in that it includes the $Si_xGe_{1-x}$ regions 604 provided in the active region 603.

As described above, the present invention represents engineering on an active region (directly under a gate electrode) and is not otherwise affected by the structure of the TFT. That is, the present invention is not limited to the TFT structure shown in FIGS. 6A through 6C and may be applied to TFTs of any structure.

A third embodiment of the present invention will now be described.

With pinning FETs as described in the first embodiment or pinning TFTs as described in the second embodiment, a CMOS circuit (inverter circuit) can be easily configured by combining n-channel and p-channel type devices on a complementary basis.

In this case, while n-channel and p-channel type pinning FETs having completely the same structure may be combined, they may have pinning regions in different configurations as described in the present embodiment.

Figure 7:
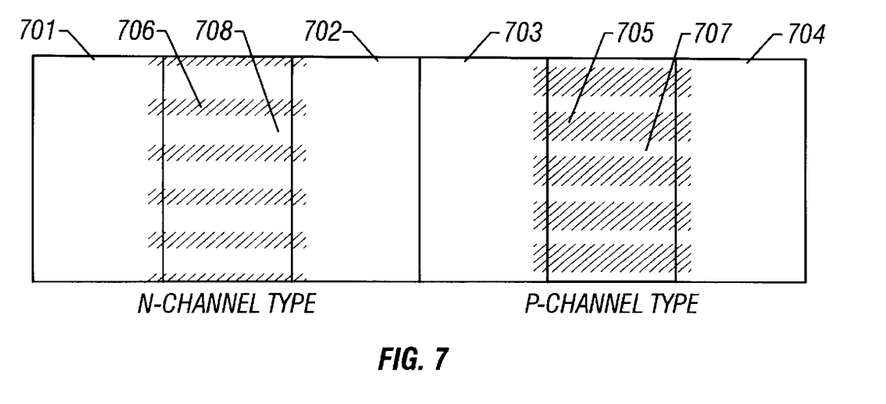
FIG. 7 illustrates a configuration of an active region.

FIG. 7 is a plan view showing only an active region and source and drain regions of a CMOS circuit which is a complementary combination of an n-channel type pinning FET and a p-channel type pinning FET. 701 designates the source region of the n-channel type pinning FET. 702 designates the drain region of the same. 704 designates the source region of the p-channel type pinning FET. 705 designates the drain region of the same.

FIG. 7 is characterized in that the width of $Si_xGe_{1-x}$ regions 705 formed in the p-channel type pinning FET is greater than the width of $Si_xGe_{1-x}$ regions 706 formed in the n-channel type pinning FET. In other words, Si regions 707 of the p-channel type pinning FET are narrower than Si region 708 of the n-channel type pinning FET.

With such a configuration, the n-channel type pinning FET may have a structure suitable for suppressing the expansion of a depletion layer from the drain because the pinning regions (Si regions) 708 occupy a large area in the same FET. That is, it becomes a structure having a reliability.

Meanwhile, the p-channel type pinning FET may have a structure suitable for increasing the amount of movement of carriers or the mobility of the carriers because the channel formation regions ($Si_xGe_{1-x}$ regions) 705 occupy a large area. That is a structure which is intended for the flow of a high current therethrough and for high speed operation.

Conventional CMOS circuits have had a problem in that the n-channel type device is often higher in mobility but less reliable whereas the p-channel device is often higher in reliability but lower in mobility.

However, the use of the structure of the present embodiment makes it possible to configure a CMOS circuit using pinning FETs, thereby providing a combination such that shortcomings of both of n-channel and p-channel types are compensated. As a result, differences between their characteristics can be corrected to provide a CMOS circuit having well-balanced characteristics and high reliability.

A fourth embodiment of the present invention will now be described.

The present embodiment shows an example wherein a semiconductor device according to the first, second or third embodiment is doped with an impurity element for increasing an energy barrier in regions to serve as pinning regions.

Specifically, in the case of an n-channel type pinning FET, Si regions to serve as pinning regions are doped with an element selected from the 13 group (typically boron, gallium or indium). In the case of a p-channel type pinning FET, Si regions are doped with an element selected from the 15 group (typically phosphorus, arsenic or antimony). For an n-channel type semiconductor device, since the majority carriers are electrons, an element from the 13 group is selected which shifts the band structure in the direction of hindering the movement of electrons. In this case, since the element from the 13 group shifts the threshold voltage in the positive direction, the threshold voltage can be controlled utilizing such an effect.

Conversely, in the case of a p-channel type semiconductor device, since the majority carriers are holes, an element from the 15 group is used which shifts the band structure in the direction of hindering the movement of holes. In this case, since the element from the 15 group shifts the threshold voltage in the negative direction, the threshold voltage can be controlled utilizing such an effect.

In such a structure, regions through which carriers move (channel formation regions) and regions for suppressing the expansion of a depletion layer (pinning regions) are clearly distinguished from each other. Such doping with impurities may be carried out using any means from among ion implantation, plasma doping and laser doping.

It is further advantageous to perform further doping of the regions which have been doped with the element from the 13 or 15 group with oxygen simultaneously. The doping with oxygen will increase the withstand voltage at the junction between those regions and the drain region. The doping with oxygen may be carried out using any of the above-described means of doping utilizing the mask which has been used for the doping with the elements from the 13 or 15 group as it is.

A fifth embodiment of the present invention will now be described.

The present embodiment refers to a configuration for utilizing the fourth effect described in the first embodiment effectively. The description will be made with reference to FIG. 8 on an n-channel type semiconductor device as an example.

Figure 8:
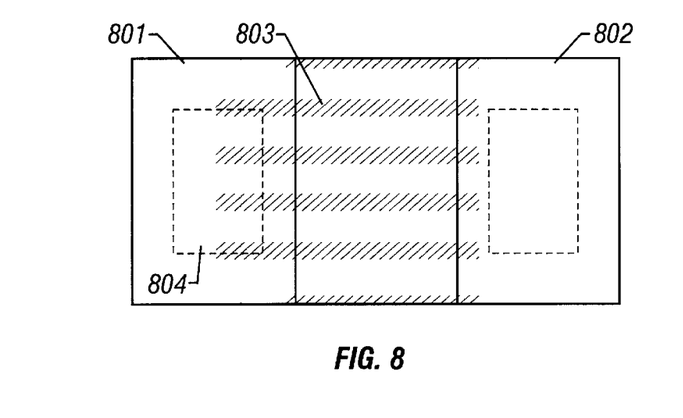
FIG. 8 illustrates a configuration of an active region.

In FIG. 8, 801 designates a source region; 802 designates a drain region; and 803 designates $Si_XGe_{1-X}$ regions (channel formation regions). 804 designates a region where a source electrode (not shown) is connected to the source region 801 (position of a contact hole).

The fourth effect, i.e., the effect of preventing the accumulation of minority carriers (holes) generated as a result of ionization by collision, is achieved when the generated holes escape to the source region along the bottom of the $Si_XGe_{1-X}$ regions.

Therefore, if the $Si_XGe_{1-X}$ regions 803 are formed long enough to extend into the connecting region 804, a configuration is provided in which the source electrode (not shown) is in direct contact with the $Si_XGe_{1-X}$ regions 803. As a result, holes which have been moved to the source region 801 along the $Si_XGe_{1-X}$ regions 803 are extracted to the outside by through the source electrode.

The effect of the present embodiment can be similarly achieved in a p-channel type semiconductor device. The present embodiment can be applied not only to individual devices such as FETs and TFTs but also to CMOS circuits and the like.

Since p-channel type semiconductor devices are less vulnerable to deterioration attributable to ionization by collision, the configuration according to the present embodiment may be applied to only n-channel type semiconductor devices.

A sixth embodiment of the present invention will now be described.

The present embodiment refers to an example of an active region having a configuration different from that in the first embodiment. The embodiment will be made with reference to an n-channel type device as an example.

The most important effect of the present embodiment is the suppression of the expansion of a depletion layer from the drain toward the source. To achieve such an effect, pinning regions to suppress the depletion layer must be provided somewhere in the active region.

Figure 9:
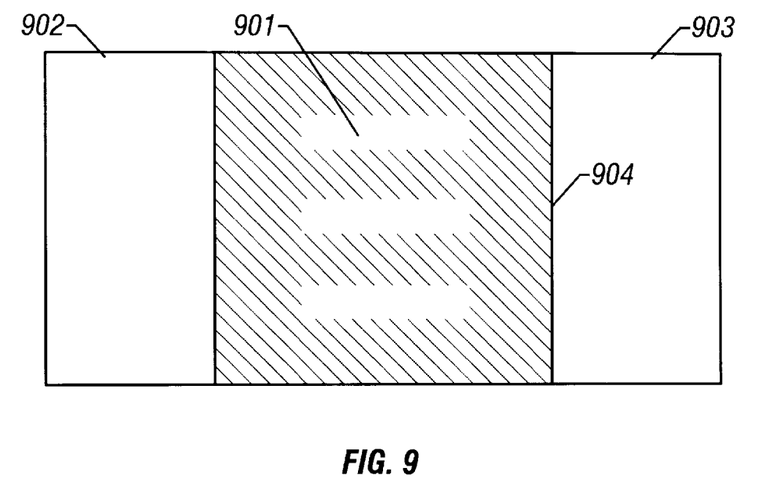
FIG. 9 illustrates a configuration of an active region.

FIG. 9 shows an example of such a configuration. In the configuration of FIG. 9, the active region is doped with germanium substantially on the entire surface thereof, and Si regions 901 are not in contact with a source region 902 and a drain region 903.

In this case, a depletion layer that expands from the drain is stopped at the Si regions 901. Further, since the Si regions 901 are not in contact with a junction 904 between the active region and drain region, no concentration of electric field occurs at the junction between the Si regions and drain region, which is effective in improving the withstand voltage.

A seventh embodiment of the present invention will now be described.

In the present embodiment, a description will be made with reference to FIG. 10 on an example wherein $Si_XGe_{1-X}$ regions are arranged in a structure different from those in the first through sixth embodiments.

Figure 10:
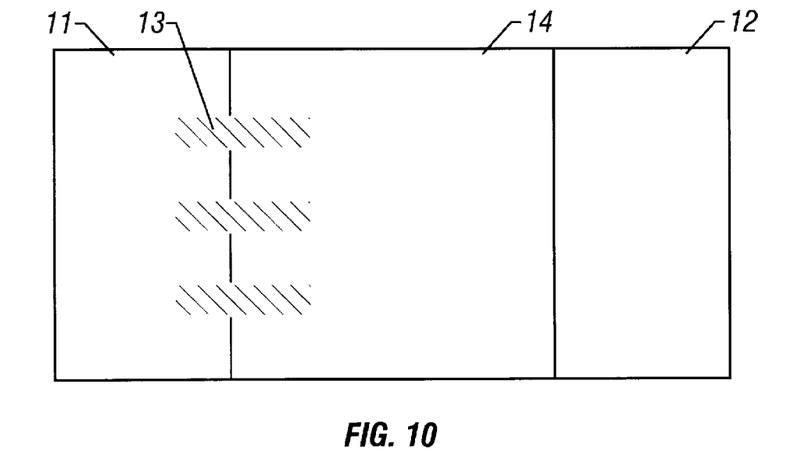
FIG. 10 illustrates a configuration of an active region.

In FIG. 10, 11 designates a source region; 12 designates a drain region; and 13 designates $Si_XGe_{1-X}$ regions. In the configuration of FIG. 10, the $Si_XGe_{1-X}$ regions extend into the source region 11 and do not contact the drain region 12.

In such a configuration, electrons extracted from the source regions move toward the drain region 12 through the $Si_XGe_{1-X}$ regions 11. Since the $Si_XGe_{1-X}$ regions 13 terminate on the way to the drain region, the electrons move through the Si regions 14 downstream thereof to reach the drain region 12.

In this case, minority carriers (holes here) generated as a result of ionization by collision drop into valence bands in the $Si_XGe_{1-X}$ regions 13 and are extracted to the source region 11 as they are. This effect becomes more significant when combined with the configuration of the sixth embodiment.

The configuration of the present embodiment can be similarly effective in a p-channel type semiconductor device. The present embodiment becomes more effective when it is used in combination with the configuration of another embodiments to add the effects of the other embodiment.

An eighth embodiment of the present invention will now be described.

The present invention may be applied to only one of the devices in the configuration of a CMOS circuit shown in the third embodiment. For example, in the configuration in FIG. 11A, a conventional FET utilizing channel doping (channel-doped FET) is used as an n-channel type FET and a pinning FET according to the present invention is used as a p-channel type FET.

Figure 11A:
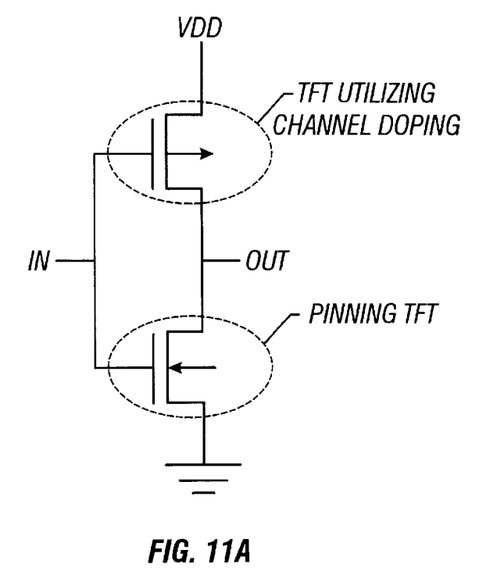
FIGS. 11A and 11B illustrate a configuration of a CMOS circuit.

In the configuration shown in FIG. 11A, the mobility of the n-channel type FET is limited in some degree because it employs channel doping in a conventional manner. Conversely, high mobility is achieved in the p-channel type FET because of pinning. This moderates any difference between the output characteristics of the n-channel type and p-channel type devices, thereby making it easy to configure a CMOS circuit which operates with stability.

Figure 11B:
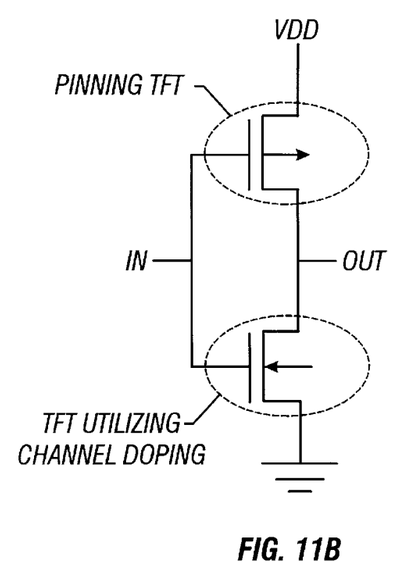

Obviously, it is possible to use a configuration as shown in FIG. 11B. In the configuration shown in FIG. 11B, a pinning FET is used as an n-channel type FET and a conventional FET utilizing channel doping is used as a p-channel type FET.

While the present embodiment has been described with reference to FETs as an example, it is obvious that the present invention may be equally applied to TFTs.

As in the present embodiment, in order to form a more preferable circuit, measures must be taken to mix pinning semiconductor devices according to the present invention and conventional semiconductor devices utilizing channel doping in appropriate locations.

A ninth embodiment of the present invention will now be described.

The present invention is applicable not only to top gate type semiconductor devices (typically planar semiconductor devices) but also to bottom gate type semiconductor devices (typically, reverse staggered semiconductor devices).

An application of the present invention to a bottom gate type semiconductor device can be combined with the configuration of another embodiment.

A tenth embodiment of the present invention will now be described.

The present embodiment refers to an example of a configuration of an electro-optical device utilizing pinning TFTs according to the present invention. It is defined here that an electro-optical device is a device which converts an electrical signal into an optical signal or a device which operates conversely.

Electro-optical devices include active matrix type liquid crystal displays, EL (electro-luminescence) displays, EC (electro-chromics) displays. It is also possible to fabricate image sensors and CCDS.

Figure 12:
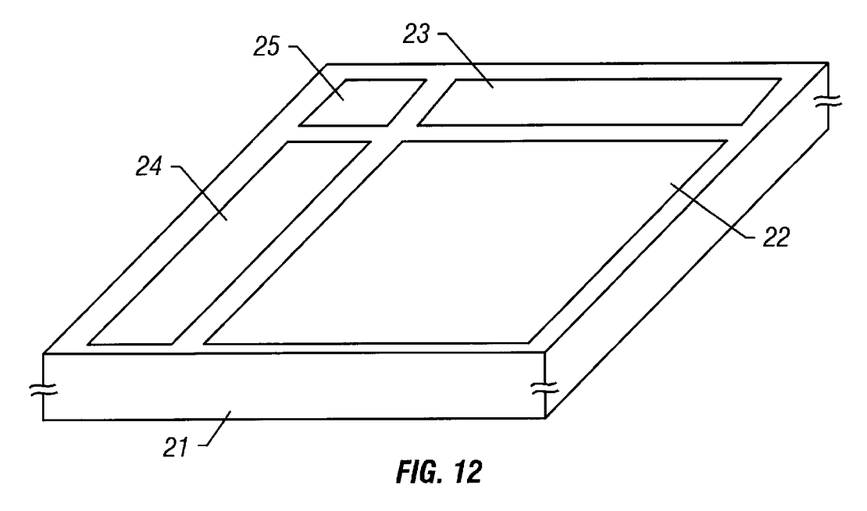
FIG. 12 illustrates a schematic configuration of an electro-optical device.

FIG. 12 shows an example of an arrangement of a part of a liquid crystal module (substrate on which devices are formed). 21 designates a substrate having an insulated surface. 22 designates a pixel matrix circuit. 23 designates a source-side driver circuit. 24 designates a gate-side driver circuit. 25 designates a logic circuit.

The source driver circuit 23 is mainly comprised of a shift register circuit, a sampling circuit, a buffer circuit and the like. The gate driver circuit 24 is mainly comprised of a shift register circuit, a buffer circuit and the like. The logic circuit 25 is comprised of a clock generation circuit, a memory circuit, an arithmetic circuit and various signal processing circuits such as a signal conversion circuit.

A pinning TFT according to the present invention may be used in all of the above-described circuits. Alternatively, it may be used in part of those circuits depending on required performance. For example, the use of a pinning TFT is effective in circuits which must operate at high speeds (the logic circuit, shift register circuits and the like). The use of a pinning TFT is also effective in the pixel matrix circuit which must have high voltage withstand characteristics.

On the other hand, the advantage of the use of a pinning TFT is not demonstrated in circuits that require a high current such as the buffer circuit and sampling circuit. With a pinning TFT according to the present invention, it is difficult to provide an on current as that in a conventional TFT in the same size because the effective channel width is reduced in an amount corresponding to the pinning regions formed therein.

Therefore, a system is preferred wherein conventional TFTs utilizing channel doping are used for circuits which require a high current and pinning TFTs according to the invention are used for circuits which do not deal with a high current and for which high speed operations and a high withstand voltage are important.

While the present embodiment has referred to an example of a configuration of an electro-optical device utilizing pinning TFTs as shown in the second embodiment, the driver circuit and logic circuits are configured based on the CMOS circuit described in the third embodiment as a basic circuit. Further, it is also possible to form the liquid crystal module of this embodiment by using the pinning FET shown in the first embodiment.

An eleventh embodiment of the present invention will now be described.

Pinning FETs or pinning TFTs according to the present invention may be used to fabricate not only an electro-optical device as shown in the tenth embodiment but also semiconductor circuits such as VLSIs and ULSIs. It is defined here that a semiconductor circuit is an electrical circuit for controlling and converting an electrical signal utilizing characteristics of a semiconductor.

For example, they may be used in microprocessors such as RISC processors, ASIC processors integrated on one chip. They may be also used in all integrated circuits utilizing a semiconductor including signal processing circuit such as D-A converters and high frequency circuits for portable apparatuses (portable telephones, PHS and mobile computers).

Figure 13:
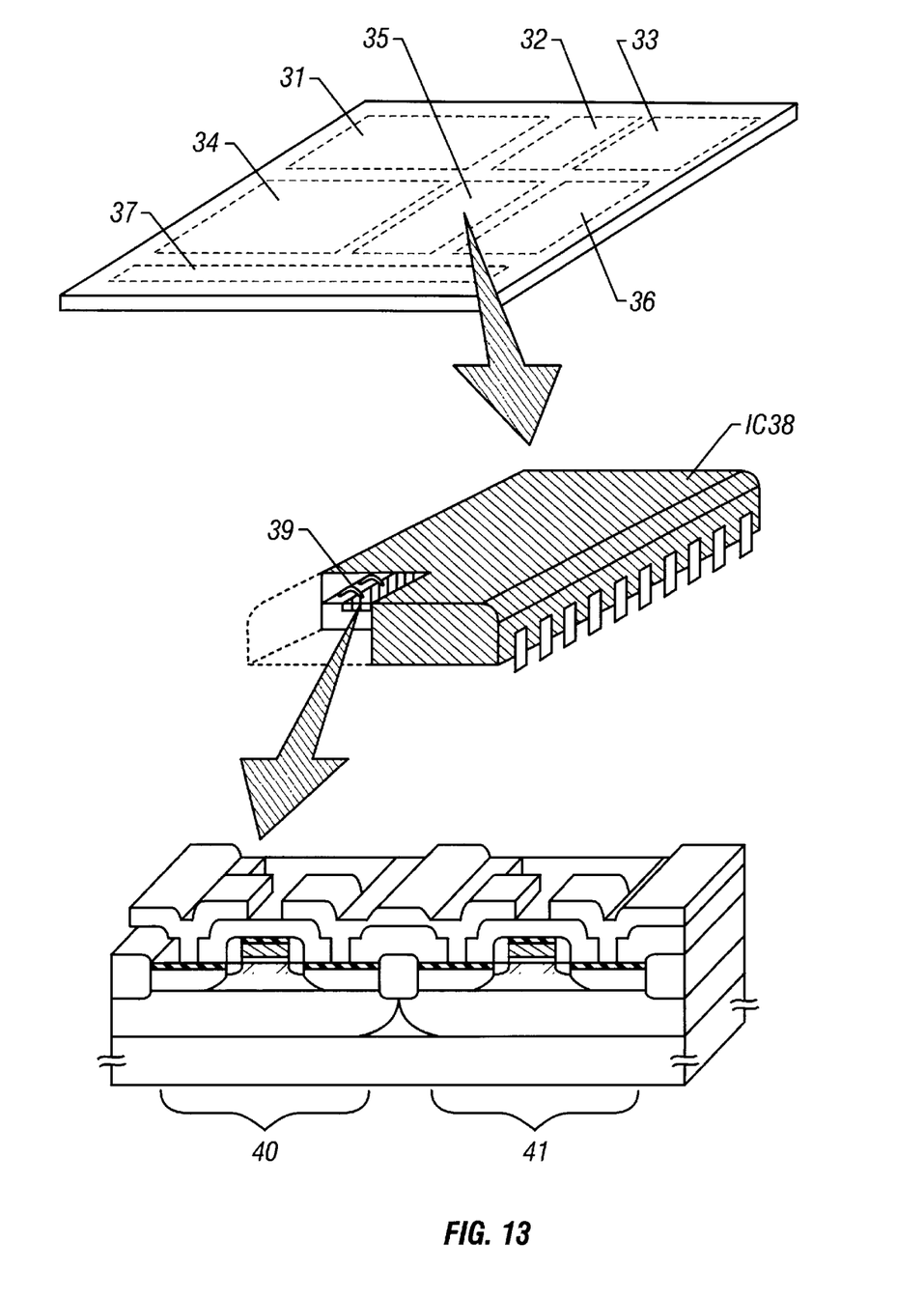
FIG. 13 illustrates a configuration of a semiconductor circuit.

FIG. 13 shows an example of a microprocessor. The microprocessor is typically comprised of a CPU core 31, a RAM 32, a clock controller 33, a cache memory 34, a cache controller 35, a serial interface 36, an I/O port 37 and the like.

The microprocessor shown in FIG. 13 is obviously a simplified example, and various circuit designs are made in actual microprocessors depending on applications.

However, an IC (integrated circuit) 38 serves as the heart of any microprocessor regardless of the functions it has. The IC 38 is a functional circuit which is an integrated circuit protected with ceramic or the like, formed on a semiconductor chip 39.

The integrated circuit formed on the semiconductor chip 39 is comprised of MOSFETs 40 (n-channel type) and 41 (p-channel type) having a structure according to the present invention. Power consumption can be reduced by configuring a basic circuit using a CMOS circuit as a minimum unit.

The microprocessor described in the present embodiment is incorporated in various electronic devices to function as a key circuit. Typical electronic devices include personal computers, personal digital assistants and all other electronic products for home use. Computers for controlling vehicles (automobiles and trains) are also included.

The pinning FETs are also advantageous when used in circuits utilizing high frequencies such as input/output signal control circuits for portable telephones, specifically MMICs (microwave module ICs) and the like.

Like the tenth embodiment, it is obvious that a configuration is preferred in which conventional channel doped semiconductor devices are used for parts which must deal with a high current and pinning semiconductor devices according to the present invention are used for parts which must have high speed operating performance and high withstand voltage performance.

A pinning semiconductor device according to the present invention may be effectively used for configuring an anti-electrostatic circuit taking advantage of the capability of allowing a high withstand voltage and high speed operation at the same time.

As described above, a pinning semiconductor device according to the present invention is a semiconductor device which satisfies high operating performance and high voltage withstand characteristic (high reliability) at the same time. Therefore, it can be used in any semiconductor device.

An twelfth embodiment of the present invention will now be described.

Electro-optical devices and semiconductor circuits configured using pinning semiconductor devices according to the present invention are used as components of various electronic devices. In the context of the present embodiment, electronic devices are defined as products incorporating semiconductor circuits or electro-optical devices.

Such electronic devices include video cameras, still cameras, projectors, head mount displays, car navigation systems, personal computers, personal digital assistants (mobile computers, portable telephones and the like). FIGS. 14A through 14F show examples thereof.

Figures 14A, 14B:
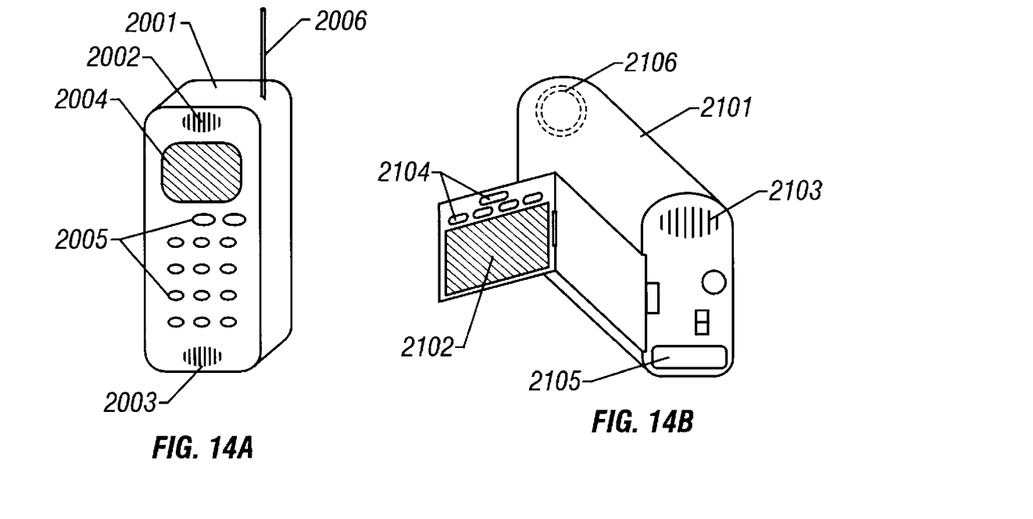
FIGS. 14A through 14F illustrate examples of electronic devices.

FIG. 14A shows a portable telephone comprised of a main body 2001, an audio output portion 2002, an audio input portion 2003, a display 2004, operation switches 2005 and an antenna 2006. The present invention can be applied to the audio output portion 2002, audio input portion 2003, display 2004 and the like.

FIG. 14B shows a video camera comprised of a main body 2101, a display 2102, an audio input portion 2103, operation switches 2104, a battery 2105 and an image-receiving portion 2106. The present invention can be applied to the display 2102, audio input portion 2103, image-receiving portion 2106 and the like.

Figure 14C:
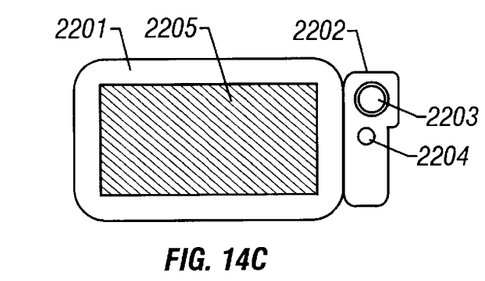

FIG. 14C shows a mobile computer comprised of a main body 2201, a camera portion 2202, an image-receiving portion 2203, operation switches 2204 and a display 2205. The present invention can be applied to the camera portion 2202, image-receiving portion 2203, display 2205 and the like.

Figure 14D:
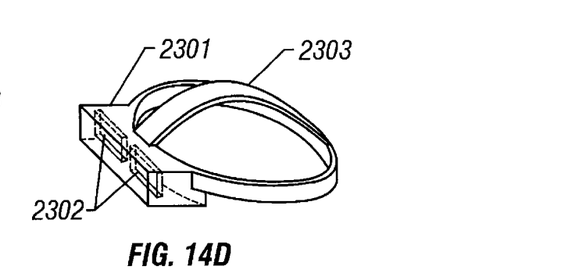

FIG. 14D shows a head mount display comprised of a main body 2301, a display 2302 and a band portion 2303. The present invention can be applied to the display 2302.

Figure 14E:
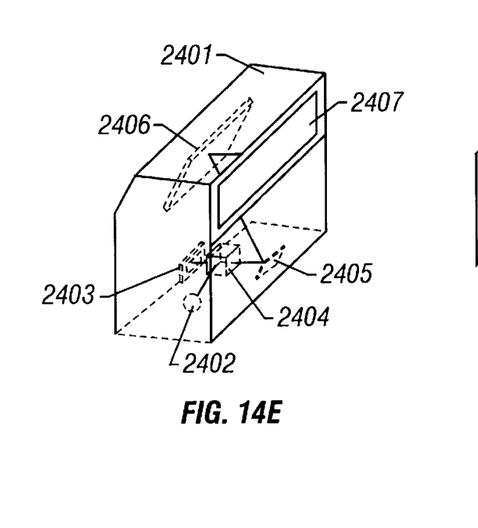

FIG. 14E shows a rear type projector comprised of a main body 2401, a light source 2402, a display 2403, a polarization beam splitter 2404, reflectors 2405 and 2406 and a screen 2407. The present invention can be applied to the display 2403.

Figure 14F:
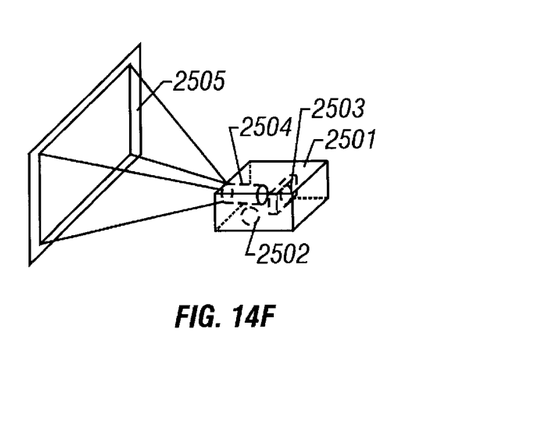

FIG. 14F shows a front type projector comprised of a main body 2501, a light source 2502, a display 2503, an optical system 2504 and a screen 2505. The present invention can be applied to the display 2503.

As described above, the present invention has a quite wide range of application and can be used in electronic devices in any field. The present invention may be applied to any product which requires an electro-optical device as in the tenth embodiment and a semiconductor circuit as in the eleventh embodiment.

The present invention makes it possible to suppress or prevent even semiconductor devices having a quite small channel length and channel width from being adversely effected by a short channel effect. Specifically, the problems of reductions in the source-drain withstand voltage and threshold voltage attributable to punch-through can be solved.

Further, since the above-described effect can be achieved without adding extra impurities in the channel formation regions (regions through which carriers move), there is no deterioration in carrier mobility. This results in an advantage in that very high mobility and high speed operating characteristics (high frequency characteristics) can be achieved.

By utilizing $Si_xGe_{1-x}$ regions as wiring for extracting minority carriers, it is possible to prevent any reduction in the source-drain withstand voltage attributable to ionization by collision.

When the above-described effects are combined, a semiconductor device can be provided in which high operating performance and high reliability can be achieved at the same time. Further, electro-optical devices and semiconductor circuits utilizing semiconductor devices according to the invention and electronic devices incorporating the same can exhibit very high performance and high reliability.

What is claimed is:

1. A semiconductor device comprising:
   a circuit formed by a transistor having a configuration including a source region, a drain region and an active region formed using a crystalline semiconductor,
   said active region comprising a $Si_xGe_{1-x}$ (0<X<1) region formed by adding germanium locally thereto and a Si region added with no germanium,
   said Si region suppressing expansion of a depletion layer from said drain region toward said source region,
   wherein said $Si_xGe_{1-x}$ (0<X<1) region and said Si region are arranged in said active region substantially in parallel and alternately with each other and arranged perpendicular to a width direction of said active region.

2. A device according to claim 1, wherein said active region comprises a region having a bandgap of $Eg_1$ and a region having a bandgap of $Eg_2$ smaller than $Eg_1$.

3. A device according to claim 2, wherein said region having the bandgap of $Eg_1$ is the Si region, said region having the bandgap of $Eg_2$ is the $Si_xGe_{1-x}$ (0<X<1) region.

4. A device according to claim 1, wherein said $Si_xGe_{1-x}$ (0<X<1) region is doped with germanium at a concentration such that X is within the range from 0.05 to 0.95.

5. A device according to claim 1, wherein said $Si_xGe_{1-x}$ (0<X<1) region is formed between said source region and said drain region.

6. A semiconductor device comprising:
   a transistor having a configuration including a source region, a drain region and an active region formed using a crystalline semiconductor,
   said active region comprising a $Si_xGe_{1-x}$ (0<X<1) region formed by adding germanium locally thereto and a Si region added with an element selected from element groups 13 and 15 of a long periodic table;
   said Si region suppressing expansion of a depletion layer from said drain region toward said source region and controlling a threshold voltage,
   wherein said $Si_xGe_{1-x}$ (0<X<1) region and said Si region are arranged in said active region substantially in parallel and alternately with each other and arranged perpendicular to a width direction of said active region.

7. A device according to claim 6, wherein said active region comprises a region having a bandgap of $Eg_1$ and a region having a bandgap of $Eg_2$ smaller than $Eg_1$.

8. A device according to claim 7, wherein said region having the bandgap of $Eg_1$ is the Si region, said region having the bandgap of $Eg_2$ is the $Si_xGe_{1-x}$ (0<X<1) region.

9. A device according to claim 6, wherein said $Si_xGe_{1-X}$ (0<X<1) region is doped with germanium at a concentration such that X is within the range from 0.05 to 0.95.

10. A device according to claim 6, wherein said $Si_xGe_{1-x}$ (0<X<1) region is formed between said source region and said drain region.

11. A semiconductor device comprising:
 a circuit formed by a transistor having a configuration including a source region, a drain region and an active region formed using a crystalline semiconductor, and
 a $Si_xGe_{1-x}$ (0<X<1) region formed by adding germanium thereto and a Si region added with no germanium being arranged in said active region substantially in parallel and alternately with each other,
 said $Si_xGe_{1-x}$ (0<X<1) region being formed between said source region and said drain region,
 wherein said $Si_xGe_{1-x}$ (0<X<1) region and said Si region are arranged in said active region substantially in parallel and arranged perpendicular to a width direction of said active region.

12. A device according to claim 11, wherein said active region comprises a region having a bandgap of $Eg_1$ and a region having a bandgap of $Eg_2$ smaller than $Eg_1$.

13. A device according to claim 12, wherein said region having the bandgap of $Eg_1$ is the Si region, said region having the bandgap of $Eg_2$ is the $Si_xGe_{1-x}$ (0<X<1) region.

14. A device according to claim 11, wherein said $Si_xGe_{1-x}$ (0<X<1) region is doped with germanium at a concentration such that X is within the range from 0.05 to 0.95.

15. A semiconductor device comprising:
 a circuit formed by a transistor having a configuration including a source region, a drain region and an active region formed using a crystalline semiconductor, and
 $Si_xGe_{1-x}$ (0<X<1) regions formed by adding germanium thereto being locally formed at the junction between said active region and said source region at intervals from each other,
 wherein said $Si_xGe_{1-x}$ (0<X<1) regions are arranged in parallel and alternately to Si regions with each other and arranged perpendicular to a width direction of said active region.

16. A device according to claim 15, wherein said active region comprises a region having a bandgap of $Eg_1$ and a region having a bandgap of $Eg_2$ smaller than $Eg_1$.

17. A device according to claim 16, wherein said region having the bandgap of $Eg_1$ is the Si region, said region having the bandgap of $Eg_2$ is the $Si_xGe_{1-x}$ (0<X<1) region.

18. A device according to claim 15, wherein said $Si_xGe_{1-x}$ (0<X<1) region is doped with germanium at a concentration such that X is within the range from 0.05 to 0.95.

19. A semiconductor device comprising:
 a circuit formed by a transistor having a configuration including a source region, a drain region and an active region formed using a crystalline semiconductor, and
 $Si_xGe_{1-x}$ (0<X<1) regions formed by adding germanium thereto being locally formed at the junction between said active region and said drain region at intervals from each other,
 wherein said $Si_xGe_{1-x}$ (0<X<1) regions are arranged in parallel and alternately to Si regions with each other and arranged perpendicular to a width direction of said active region.

20. A device according to claim 19, wherein said active region comprises a region having a bandgap of $Eg_1$ and a region having a bandgap of $Eg_2$ smaller than $Eg_1$.

21. A device according to claim 20, wherein said region having the bandgap of $Eg_1$ is the Si region, said region having the bandgap of $Eg_2$ is the $Si_xGe_{1-x}$ (0<X<1) region.

22. A device according to claim 19, wherein said $Si_xGe_{1-x}$ (0<X<1) region is doped with germanium at a concentration such that X is within the range from 0.05 to 0.95.

23. A device according to claim 1, wherein said device is one selected from the group consisting of a portable telephone, a video camera, a mobile computer and a projector.

24. A device according to claim 1, wherein said device is an EL display device.

25. A device according to claim 6, wherein said device is one selected from the group consisting of a portable telephone, a video camera, a mobile computer and a projector.

26. A device according to claim 6, wherein said device is an EL display device.

27. A device according to claim 11, wherein said device is one selected from the group consisting of a portable telephone, a video camera, a mobile computer and a projector.

28. A device according to claim 11, wherein said device is an EL display device.

29. A device according to claim 15, wherein said device is one selected from the group consisting of a portable telephone, a video camera, a mobile computer and a projector.

30. A device according to claim 15, wherein said device is an EL display device.

31. A device according to claim 19, wherein said device is one selected from the group consisting of a portable telephone, a video camera, a mobile computer and a projector.

32. A device according to claim 19, wherein said device is an EL display device.

* * * * *